(12) United States Patent
Colby

(10) Patent No.: US 7,035,072 B2
(45) Date of Patent: Apr. 25, 2006

(54) ELECTROSTATIC DISCHARGE APPARATUS FOR NETWORK DEVICES

(75) Inventor: James A. Colby, Lombard, IL (US)

(73) Assignee: Littelfuse, Inc., Des Plaines, IL (US)

( * ) Notice: Subject to any disclaimer, the term of this patent is extended or adjusted under 35 U.S.C. 154(b) by 0 days.

(21) Appl. No.: 10/192,314

(22) Filed: Jul. 10, 2002

(65) Prior Publication Data

US 2003/0011026 A1 Jan. 16, 2003

Related U.S. Application Data

(60) Provisional application No. 60/304,374, filed on Jul. 10, 2001.

(51) Int. Cl.
*H01C 7/10* (2006.01)
*H01C 7/12* (2006.01)
*H01C 7/13* (2006.01)
*H02H 1/04* (2006.01)

(52) U.S. Cl. .................. 361/118; 361/111; 361/119; 361/127; 338/20

(58) Field of Classification Search ............ 361/111, 361/56, 127, 119, 118; 338/20, 21
See application file for complete search history.

(56) References Cited

U.S. PATENT DOCUMENTS

| | | |
|---|---|---|
| 2,273,704 A | 2/1942 | Grisdale |
| 2,796,505 A | 6/1957 | Bocciarelli |
| 3,500,276 A | 3/1970 | Hingorany et al. |
| 3,619,725 A | 11/1971 | Mendham et al. |
| 3,685,026 A | 8/1972 | Wakabayashi et al. |
| 3,685,028 A | 8/1972 | Wakabayashi et al. |
| 3,743,894 A | 7/1973 | Hall et al. |
| 3,772,774 A | 11/1973 | Knippenberg et al. |
| 3,913,219 A | 10/1975 | Lichtblau |
| 3,916,366 A | 10/1975 | Jefferson |
| 3,936,700 A | 2/1976 | Reiter |
| 4,045,712 A | 8/1977 | De Tommasi |
| 4,157,527 A | 6/1979 | Philipp |

(Continued)

FOREIGN PATENT DOCUMENTS

CH 663 491 12/1987

(Continued)

OTHER PUBLICATIONS

Micrel Product Brochure, entitled: "MIC2505/2506 Single 2A/Dual 1A/High-Side Switches", no date.

(Continued)

*Primary Examiner*—Kim Huynh
*Assistant Examiner*—Tanh Q. Nguyen
(74) *Attorney, Agent, or Firm*—Bell, Boyd & Lloyd LLC

(57) ABSTRACT

The present invention provides an ESD apparatus that includes an electrical overstress suppression device in series with a capacitor. The ESD apparatus is ideally suited for use with network communication devices, but any electronic device requiring overvoltage protection and isolation may employ the ESD apparatus of the present invention. In one embodiment, the ESD apparatus includes a capacitor and an electrical overstress protection device that electrically communicates in series with the capacitor. In another embodiment, the ESD apparatus includes an electrical overstress protection device having a voltage variable material and a capacitor that electrically communicates in series with the overstress protection device. The capacitor is sized so that the overstress device can withstand an application of a predetermined steady state voltage.

29 Claims, 3 Drawing Sheets

U.S. PATENT DOCUMENTS

| | | | |
|---|---|---|---|
| 4,164,725 | A | 8/1979 | Wiebe |
| 4,198,744 | A | 4/1980 | Nicolay |
| 4,252,692 | A | 2/1981 | Taylor et al. |
| 4,278,706 | A | 7/1981 | Barry |
| 4,280,221 | A | 7/1981 | Chun et al. |
| 4,331,948 | A | 5/1982 | Malinaric et al. |
| 4,359,414 | A | 11/1982 | Mastrangelo |
| 4,413,300 | A | 11/1983 | Sumi et al. |
| 4,503,415 | A | 3/1985 | Rooney et al. |
| 4,514,718 | A | 4/1985 | Birx |
| 4,533,896 | A | 8/1985 | Belopolsky |
| 4,540,969 | A | 9/1985 | Sugar |
| 4,547,830 | A | 10/1985 | Yamauchi |
| 4,554,732 | A | 11/1985 | Sadlo et al. |
| 4,559,579 | A | 12/1985 | Val |
| 4,612,529 | A | 9/1986 | Gurevich et al. |
| 4,626,818 | A | 12/1986 | Hilgers |
| 4,652,848 | A | 3/1987 | Hundrieser |
| 4,720,402 | A | 1/1988 | Wojcik |
| 4,726,991 | A | 2/1988 | Hyatt et al. |
| 4,758,920 | A | 7/1988 | McCartney |
| 4,771,260 | A | 9/1988 | Gurevich |
| 4,792,781 | A | 12/1988 | Takahashi et al. |
| 4,837,520 | A | 6/1989 | Golke et al. |
| 4,873,506 | A | 10/1989 | Gurevich |
| 4,928,199 | A | 5/1990 | Diaz et al. |
| 4,958,426 | A | 9/1990 | Endo et al. |
| 4,975,551 | A | 12/1990 | Syvertson |
| 4,977,357 | A | 12/1990 | Shrier |
| 4,992,333 | A | 2/1991 | Hyatt |
| 5,068,634 | A | 11/1991 | Shrier |
| 5,084,691 | A | 1/1992 | Lester et al. |
| 5,095,297 | A | 3/1992 | Perreault et al. |
| 5,097,246 | A | 3/1992 | Cook et al. |
| 5,097,247 | A | 3/1992 | Doerrwaechter |
| 5,099,380 | A | 3/1992 | Childers et al. |
| 5,102,506 | A | 4/1992 | Tanielian |
| 5,102,712 | A | 4/1992 | Peirce et al. |
| 5,115,220 | A | 5/1992 | Suuronen et al. |
| 5,140,295 | A | 8/1992 | Vermot-gaud et al. |
| 5,142,263 | A | 8/1992 | Childers et al. |
| 5,148,141 | A | 9/1992 | Suuronen |
| 5,155,462 | A | 10/1992 | Morrill, Jr. |
| 5,166,656 | A | 11/1992 | Badihi et al. |
| 5,183,698 | A | 2/1993 | Stephenson et al. |
| 5,189,387 | A | 2/1993 | Childers et al. |
| 5,232,758 | A | 8/1993 | Juskey et al. |
| 5,246,388 | A | 9/1993 | Collins et al. |
| 5,248,517 | A | 9/1993 | Shrier et al. |
| 5,260,848 | A | 11/1993 | Childers |
| 5,262,754 | A | 11/1993 | Collins |
| 5,273,815 | A | 12/1993 | Brydon et al. |
| 5,278,535 | A | 1/1994 | Xu et al. |
| 5,290,821 | A | 3/1994 | Sakurai et al. |
| 5,294,374 | A | 3/1994 | Martinez et al. |
| 5,327,319 | A * | 7/1994 | Lee et al. ................ 361/118 |
| 5,335,137 | A | 8/1994 | English et al. |
| 5,340,641 | A | 8/1994 | Xu |
| 5,340,775 | A | 8/1994 | Carruthers et al. |
| 5,350,594 | A | 9/1994 | Unruh |
| 5,363,082 | A | 11/1994 | Gurevich |
| 5,374,590 | A | 12/1994 | Batdorf et al. |
| 5,384,190 | A | 1/1995 | Kaburaki |
| 5,386,335 | A | 1/1995 | Amano et al. |
| 5,393,597 | A | 2/1995 | Childers et al. |
| 5,438,166 | A | 8/1995 | Carey et al. |
| 5,448,095 | A | 9/1995 | Hennessy et al. |
| 5,476,714 | A | 12/1995 | Hyatt |
| 5,493,469 | A * | 2/1996 | Lace .................... 361/119 |
| 5,508,224 | A | 4/1996 | Jang |
| 5,510,947 | A | 4/1996 | Pellegrini et al. |
| 5,537,108 | A | 7/1996 | Nathan et al. |
| 5,545,910 | A | 8/1996 | Jang |
| 5,592,016 | A | 1/1997 | Go et al. |
| 5,594,204 | A | 1/1997 | Taylor et al. |
| 5,646,434 | A | 7/1997 | Chrysostomides et al. |
| 5,647,767 | A | 7/1997 | Scheer et al. |
| 5,669,381 | A | 9/1997 | Hyatt |
| 5,675,813 | A | 10/1997 | Holmdahl |
| 5,707,886 | A | 1/1998 | Consiglio et al. |
| 5,753,982 | A | 5/1998 | Yeh |
| 5,756,007 | A | 5/1998 | Franey |
| 5,777,368 | A | 7/1998 | Wu et al. |
| 5,781,395 | A | 7/1998 | Hyatt |
| 5,790,363 | A * | 8/1998 | Chaudhry .................. 361/119 |
| 5,796,570 | A | 8/1998 | Mekdhanasarn et al. |
| 5,807,509 | A | 9/1998 | Shrier et al. |
| 5,869,869 | A | 2/1999 | Hively |
| 5,889,308 | A | 3/1999 | Hong et al. |
| 5,905,623 | A * | 5/1999 | McCartney ................. 361/119 |
| 5,938,050 | A | 8/1999 | Roesner |
| 5,955,762 | A | 9/1999 | Hively |
| 5,958,537 | A | 9/1999 | Akhter |
| 5,970,321 | A | 10/1999 | Hively |
| 5,973,588 | A | 10/1999 | Cowman et al. |
| 5,974,661 | A | 11/1999 | Neuhalfen |
| 6,000,042 | A | 12/1999 | Henrie |
| 6,018,299 | A | 1/2000 | Eberhardt |
| 6,023,028 | A | 2/2000 | Neuhalfen |
| 6,087,923 | A | 7/2000 | Ahn et al. |
| 6,097,066 | A | 8/2000 | Lee et al. |
| 6,108,184 | A | 8/2000 | Minervini et al. |
| 6,191,928 | B1 | 2/2001 | Rector et al. |
| 6,211,554 | B1 | 4/2001 | Whitney |
| 6,239,687 | B1 | 5/2001 | Shrier et al. |
| 6,251,513 | B1 | 6/2001 | Rector et al. |

FOREIGN PATENT DOCUMENTS

| | | |
|---|---|---|
| DE | 3530354 | 3/1987 |
| DE | 3728489 | 3/1989 |
| EP | 0270954 | 6/1988 |
| EP | 0301533 | 2/1989 |
| EP | 0453217 | 10/1991 |
| EP | 581428 | 2/1994 |
| EP | 625808 | 11/1994 |
| GB | 1477572 | 6/1977 |
| GB | 1604820 | 12/1981 |
| GB | 2089148 | 6/1982 |
| JP | 433230 | 2/1992 |
| JP | 4242036 | 8/1992 |
| JP | 4245129 | 9/1992 |
| JP | 4245132 | 9/1992 |
| JP | 4248221 | 9/1992 |
| JP | 4255627 | 9/1992 |
| JP | 5166454 | 7/1993 |
| JP | 5314888 | 11/1993 |
| JP | 6103880 | 4/1994 |
| WO | 83/01153 | 3/1983 |
| WO | 90/00305 | 1/1990 |
| WO | 91/14279 | 9/1991 |
| WO | 97/21230 | 6/1997 |
| WO | 99/46819 | 9/1999 |
| WO | 99/46820 | 9/1999 |

OTHER PUBLICATIONS

Unitrode Product Brochure; entitled: "UCC3912 Programmable Hot Swap Power Manager", no date.

* cited by examiner

ELECTROSTATIC DISCHARGE APPARATUS FOR NETWORK DEVICES

PRIORITY CLAIM

This application is a non-provisional application claiming the benefit of U.S. Provisional Patent Application No. 60/304,374, filed Jul. 10, 2001, bearing the same title as above.

BACKGROUND OF THE INVENTION

The present invention relates to overvoltage protection of electrically isolated systems. More particularly, the present invention relates to an improved electrostatic discharge ("ESD") apparatus that may be employed in Ethernet systems.

Electrical overstress transients ("EOS transients") produce high electric fields and high peak powers that can render circuits, or the highly sensitive electrical components in the circuits, temporarily or permanently non-functional. EOS transients can include transient voltages or current conditions capable of interrupting circuit operation or destroying the circuit outright. EOS transients may arise, for example, from an electromagnetic pulse, an electrostatic discharge, e.g., from a device or a human body, lightning, a build up of static electricity or be induced by the operation of other electronic or electrical components. An EOS transient can rise to its maximum amplitude in subnanosecond to microsecond times and have repeating amplitude peaks.

The peak amplitude of the electrostatic discharge (ESD) transient wave may exceed 25,000 volts with currents of more than 100 amperes. There exist several standards which define the waveform of the EOS transient. These include IEC 61000-4-2, ANSI guidelines on ESD (ANSI C63.16), DO-160, and FAA-20-136. There also exist military standards, such as MIL STD 883 part 3015.7.

Materials exist for the protection against EOS transients ("EOS materials"), which are designed to rapidly respond (i.e., ideally before the transient wave reaches its peak) to reduce the transmitted voltage to a much lower value and clamp the voltage at the lower value for the duration of the EOS transient. EOS materials are characterized by having high electrical impedance values at low or normal operating voltages and currents. In response to an EOS transient, the materials switch essentially instantaneously to a low electrical impedance state. When the EOS threat has been mitigated these materials return to their high impedance state. These materials are capable of repeated switching between the high and low impedance states, allowing circuit protection against multiple EOS events.

EOS materials also recover essentially instantaneously to their original high impedance value upon termination of the EOS transient. EOS materials can switch to the low impedance state thousands of times, withstanding thousands of ESD events, and recover to the high impedance state after providing protection from each of the individual ESD events.

Circuit components utilizing EOS materials can shunt a portion of the excessive voltage or current due to the EOS transient to ground, protecting the electrical circuit and its components. The major portion of a fast rise time transient, however, is reflected back towards the source of the threat. The reflected wave is either attenuated by the source, radiated away, or re-directed back to the surge protection device which responds to each return pulse until the threat energy is reduced to safe levels.

One electrical device for providing protection against EOS transients is disclosed in U.S. Pat. No. 6,211,554 B1, assigned to the assignee of this invention, and incorporated herein by reference. One voltage variable material ("VVM") or composition for providing protection against electrical overstress is disclosed in U.S. patent application Ser. No. 09/136,507, assigned to the assignee of this invention, and is also incorporated herein by reference.

Typical local area network ("LAN") design uses an Ethernet protocol, which usually requires a base band or a broad band transmission. Because LAN's typically encompass large distances between network devices (servers, work stations, printers, etc.), the ground potential may vary significantly from location to location. This might result in data transmission errors and even equipment damage if the data communication lines are referenced to earth ground. For this reason, transceivers for LAN and telecom applications are typically differential mode devices, usually isolated from the network wiring by transformers. These transformers efficiently couple the differential mode data signals from the twisted pair network wiring to the transceiver devices, while attenuating common mode signals such as those resulting form ground potential differences.

Another source of common mode signals are radiated transients from building power lines caused by load switching in equipment such as air conditioners, heaters, elevators, copiers and laser printers. It is also possible to couple common mode ESD signals to the network wiring by direct discharge to the cable or a cable connector, or by electric or magnetic field coupling to the cable.

Although an ideal transformer would couple a zero common mode signal from the primary (network wiring side) to the secondary (network device transceiver side), real transformers have some capacitance linking the primary and secondary windings, which allows some common mode current to flow across the transformer. Common mode chokes and differential mode transceivers further attenuate or reject the common mode signal, but high amplitude, fast rise signals such as those resulting from ESD may still cause system malfunction or damage.

Connection ports on network communication devices must be electrically isolated according to established standards. For example, Ethernet 10BaseT network communication devices must comply with International Standard ISO/IEC8802-3 (ANSI/IEEE Standard 802.3), and 100BaseT network communication devices must comply with the standards set forth in ANSI X3.263-1995, Section 8.4.1 1. For the 10BaseT devices, Standard 802.3 requires that for each PMA/MDI interface, such as that found in an RJ-45 connector, the connections to the network wiring must be isolated from ground for DC voltage levels as high as 2500 volts.

Known VVM type ESD apparatuses cannot withstand the presence of a high voltage, steady state signal. Other types of ESD protection, such as spark gaps, are less reliable. Spark gaps are subject to environmental conditions, such as heat and humidity. Moreover, spark gaps can degrade after repeated ESD events. This presents a problem for networked communication systems that require ESD protection and high voltage, direct current isolation. Accordingly, a need exists for a reliable VVM type ESD apparatus that can withstand the presence of a high voltage (e.g., 2500 VDC), steady state signal.

SUMMARY OF THE INVENTION

The present invention provides an improved electrostatic discharge ("ESD") apparatus. More specifically, the present invention provides an ESD apparatus that includes an electrical overstress suppression device in series with a capacitor. The ESD apparatus is ideally suited for use with network communication devices, but any electronic device requiring ESD protection and isolation may employ the ESD apparatus of the present invention.

To this end, in one embodiment of the present invention, an ESD apparatus is provided. The ESD apparatus includes a capacitor and an electrical overstress protection device having a polymeric, non-ohmic voltage variable material that electrically communicates in series with the capacitor.

In an embodiment, the apparatus includes a signal line that electrically communicates with the overstress protection device.

In an embodiment, the signal line Is a data line selected from a group consisting of 10BaseT, 100BaseT and 1000BaseT data lines.

In an embodiment, the ESD apparatus includes an Ethernet network device that electrically communicates with the signal line.

In an embodiment, the ESD apparatus includes a transceiver that electrically communicates with the signal line.

In an embodiment, the ESD apparatus includes an earth ground that electrically communicates with the overstress protection device.

In an embodiment, the capacitor is sized so that the ESD device can withstand an application of a predetermined steady state or direct current voltage.

In an embodiment, the capacitor blocks DC current that travels from a signal line to ground.

In an embodiment, the capacitor couples to an unused data line of a data transmission connector.

In an embodiment, the ESD protection device and the capacitor are affixed to a printed circuit board ("PCB").

In an embodiment, the device and the capacitor electrically communicate with at least one PCB trace that electrically communicates with a data transmission connector.

In an embodiment, the ESD protection device and the capacitor are affixed to a flexible circuit.

In an embodiment, the ESD device and the capacitor electrically communicate with a spring contact affixed to the flexible circuit.

In an embodiment, a plurality of EOS devices and capacitors electrically communicate with a plurality of contacts affixed to the flexible circuit.

In an embodiment, the EOS device and the capacitor electrically communicate with a connector pin of an electrical device.

In another embodiment of the present invention, an electrostatic discharge ("ESD") apparatus is provided. The ESD apparatus includes a non-ohmic voltage variable material ("VVM") and a capacitor or a capacitor material that electrically communicates in series with the VVM. The capacitor is sized so that the VVM can withstand an application of a predetermined steady state voltage.

In an embodiment, the voltage variable material includes a matrix of conductive and semiconductive particles having an average particle size of less than 10 microns.

In an embodiment, the matrix further includes insulative particles having an average particle size larger than 300 angstroms.

In an embodiment, the voltage variable material includes irregularly shaped conductor particles having insulative oxide surface coatings that are bound in a matrix.

In an embodiment, the voltage variable material includes a mixture of conductive and semiconductive particles having surfaces coated with an insulative oxide film, the conductive and semiconductive particles being bound together in an insulative binder.

In an embodiment, the voltage variable material includes conductive and semiconductive particles that are coated with an insulative oxide film and that are bound together in point contact with one another.

In an embodiment, the voltage variable material includes conductive and semiconductive particles sized to be 10 to 20 microns.

In an embodiment, the voltage variable material includes particles sized to be 10 to 20 microns and spaced apart at least 1000 angstroms.

In an embodiment, the VVM and a capacitor or a capacitor material are placed inside a common housing.

In an embodiment, the VVM is self-adhering and is self-adhered to a PCB, polymide, flex circuit or inside a housing with a capacitor or a capacitor material.

In a further embodiment of the present invention, an electrical circuit for electrostatic discharge suppression is provided. The circuit includes a signal line and a capacitor that electrically communicates with the signal line. The circuit includes an electrical overstress protection device having a polymeric, non-ohmic voltage variable material that electrically communicates in series with the capacitor. The circuit also includes an earth ground that electrically communicates with the overstress protection device.

In an embodiment, the circuit includes an Ethernet network device that electrically communicates with the signal line.

It is therefore an advantage of the present invention to provide an ESD apparatus for use in Ethernet LAN networks.

Another advantage of the present invention is to provide an ESD apparatus having a steady state blocking function.

A further advantage of the present invention is to provide an ESD apparatus that can withstand IEEE 802.3 testing and maintain proper suppression of EOS transients.

Yet another advantage of the present invention is to provide an ESD apparatus in which high speed data travels across an aggregate capacitance that is less than the capacitance of an electrical overstress protection device that forms part of the ESD apparatus, and wherein the apparatus does not compromise the integrity of the high speed data.

Additional features and advantages of the present invention will be described in, and apparent from, the following Detailed Description of the Preferred Embodiments and the Drawings.

DETAILED DESCRIPTION OF THE INVENTION

Figure 1:
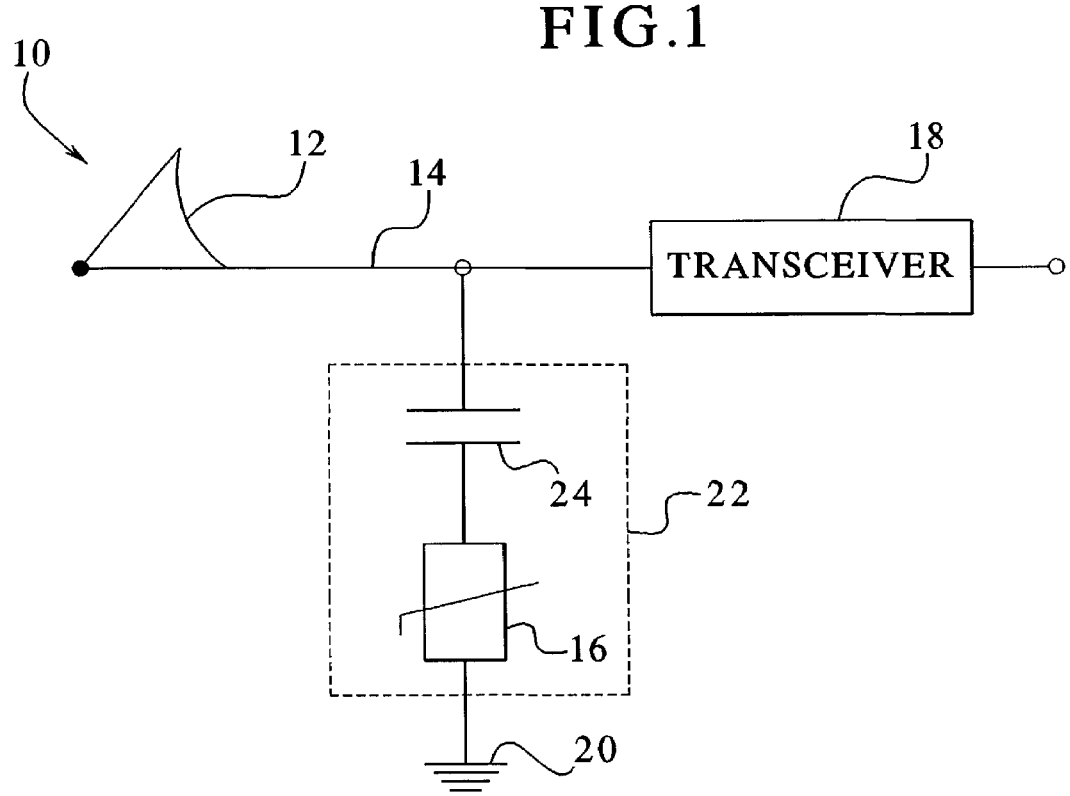
FIG. 1 is a schematic electrical diagram of one embodiment of the improved ESD apparatus of the present invention.

Referring now to the drawings and in particular to FIG. 1, a schematic electrical diagram illustrates one embodiment of the improved ESD apparatus of the present invention. It should be appreciated that in one preferred embodiment, the improved ESD apparatus is adapted for use with a network communication device. Those skilled in the art will recognize that the apparatus may be used in any electronic system requiring ESD transient protection.

In FIG. 1, an EOS transient voltage 12 enters the circuit 10 on signal line 14. In normal operation, an overstress protection device 16 has a high impedance so that current normally flows to a transceiver 18 and not to the protection device 16. Upon the appearance of an EOS transient voltage 12, the protection device 16 switches from the high impedance state to a low impedance state. A portion of the transient voltage 12 from the signal line 14 dissipates to the earth ground 20. The protection device 16 reflects most of the transient voltage 12 back towards the source of the threat.

In one embodiment, the signal line 14 is a high speed data line, which requires a large frequency band width or operating frequency range to allow many carrier frequencies to exist on a single cable. The IEEE 802.3 Ethernet specification requires that the ESD apparatus or apparatus 22 be able to withstand 2,250 VDC. The protection device 16 of the apparatus 22 cannot withstand this high voltage steady state signal. The apparatus 22 therefore includes a capacitor 24, which is connected in series with the protection device 16 between the signal line 14 and earth ground 20. In this embodiment the capacitor 24 is placed between the signal line 14 and the protection device 16.

As is well known in the art, a coupling type capacitor, such as capacitor 24, allows alternating current to pass through the capacitor but does not allow DC current to pass through the capacitor, except for an initial surge of current. The protection device 16 can withstand this initial burst of current. The capacitor 24 of the apparatus 22, if sized correctly, does not allow the protection device 16 to see the 2,250 VDC steady state voltage, other than the initial burst of current, because the capacitor 24 does not permit DC current to travel to earth ground 20.

The capacitance of capacitor 24 must be properly selected. If the capacitance is too small, overshoot and undershoot may occur. If the capacitance is too large, the capacitor 24 absorbs an excessive amount of power. Power dissipation in the capacitor 24 is a function of the frequency, duty cycle, and bit pattern of the telecommunications data. These factors affect the charging and discharging of capacitor 24 and therefore the power dissipation capability of the apparatus 22.

If the capacitor value is properly selected, however, the coupling capacitor 24 of the apparatus 22 blocks DC current and thereby protects the protection device 16 and saves considerable power. Further, an appropriate choice of the capacitor value results in the waveform at the load end of signal line 14 that is nearly identical to the input waveform. That is, the apparatus 22 does not materially alter the shape or magnitude of the input waveform.

The apparatus 22 combats both common mode and differential mode transients. In one embodiment, each Ethernet signal line 14 is individually isolated so that each transceiver 18 is isolated from differential currents flowing between different signal lines 14 and from common mode currents flowing from interconnected leads to ground. Also, because the protection device 16 only shunts a portion of an EOS transient to ground, most of the transient voltage spike 12 is sent back to its source, reducing the occurrence of common mode currents.

It is well known that capacitors in series add in reciprocal, e.g., 1/Ctotal=1/Ccapacitor+1/Cprotection device. This results in a total series capacitance that is always less than the smallest capacitance in the series. The capacitance of the protection device 16 is typically significantly smaller than that of the capacitor 24, so that the total capacitance for the apparatus 22 is roughly the same or slightly less than that of the capacitance of the protection device 16.

The high speed data that appears on the line 14, to which the apparatus 22 is attached, sees the aggregate capacitance of the two devices, which is approximately the same or less than that of the protection device 16 alone. Relative to other circuit protection methods, the apparatus 22 should therefore work better as data lines increase in speed.

Figure 2:
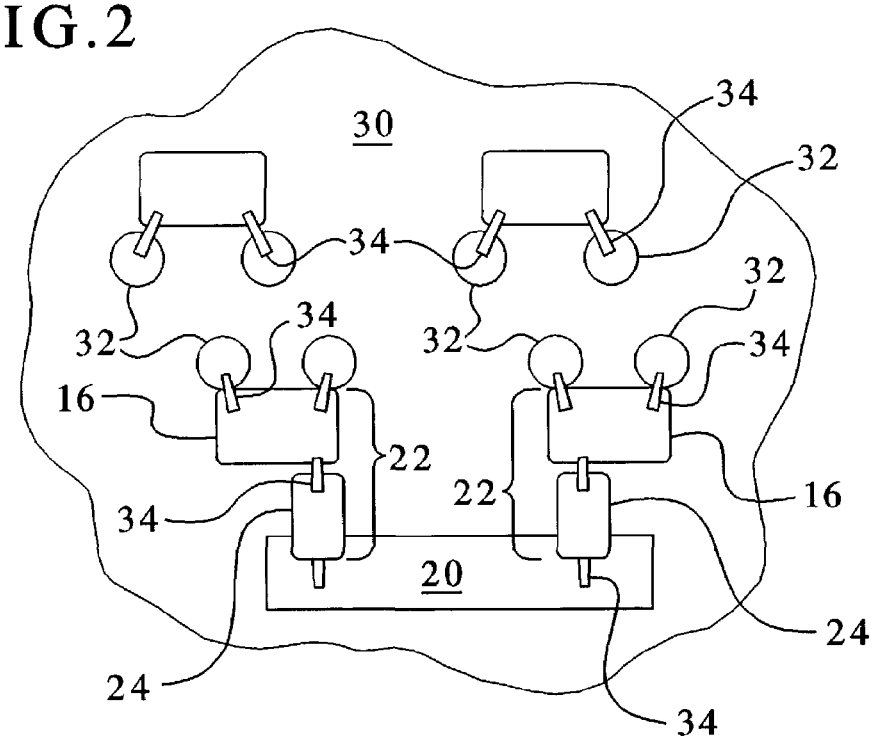
FIG. 2 is a fragmentary plan view of a section of a printed circuit board showing one possible installation for the improved ESD apparatus of the present invention.

Referring now to FIG. 2, in another embodiment, a plurality of apparatuses 22 are surface mounted to one side of a PCB substrate 30. A ground bus 20 is soldered to one end of a plurality of capacitors 24, as indicated by the solder joints 34. The capacitors 24 are each soldered directly to leads (not illustrated) provided by the overstress protection devices 16. The overstress protection devices are in turn soldered to the terminals 32 of a transceiver (not illustrated, can be located on other side of PCB 30). In one embodiment, the terminals 32 electrically connect to a data transmission connector, such as an RJ-45 connector. Methods for surface mounting of the overstress protection device 16 and the capacitor 24 of the apparatus 22 of the present invention such as reflow soldering are well known.

The apparatus 22 illustrated in FIG. 2 has been successfully tested. In testing performed on the apparatus 22, using a PulseGuard® Model PGB002ST23 ESD protection device 16, the protection device 16 withstood the required 2,250 VDC steady state voltage for sixty (60) seconds. Moreover, the testing showed that a transceiver chip withstood repeated 15 kV air discharge zaps to the data line, e.g., a terminal of an RJ-45 connector. When an EOS transient voltage 12 occurs, the capacitor 24 of the apparatus 22 appears as a short with respect to the transient spike 12, so that the protection device 16 operates as designed to protect the transceiver 18. In an embodiment, the capacitor 24 is a 1,000 pF capacitor rated for the voltage specified by regulation.

It should be appreciated that in this embodiment, as opposed to the embodiment of FIG. 1, the capacitor 24 is positioned between the protection device 16 and the ground bus 20. The DC coupling capacitor 24 disallows DC current to flow from the transceiver terminals 32 to the ground bus 20, and thereby protects the protection device 16 from hill DC voltages. Both configurations of the protection device 16 and the capacitor 24 between signal line and ground serve to protect the protection device 16 and both configurations are included in the present invention.

Figure 3A:
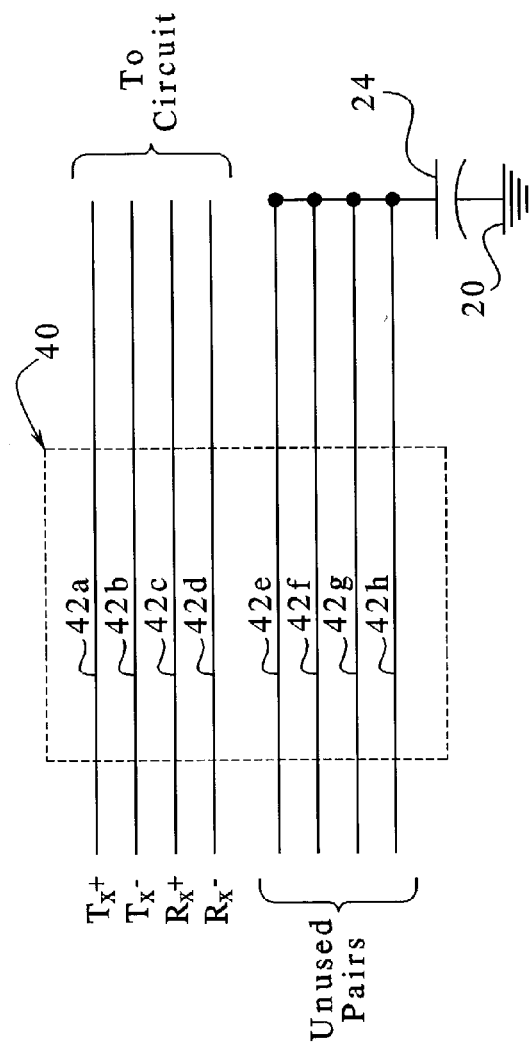
FIG. 3A illustrates a schematic electrical diagram for a known data transmission connector.
Figure 3B:
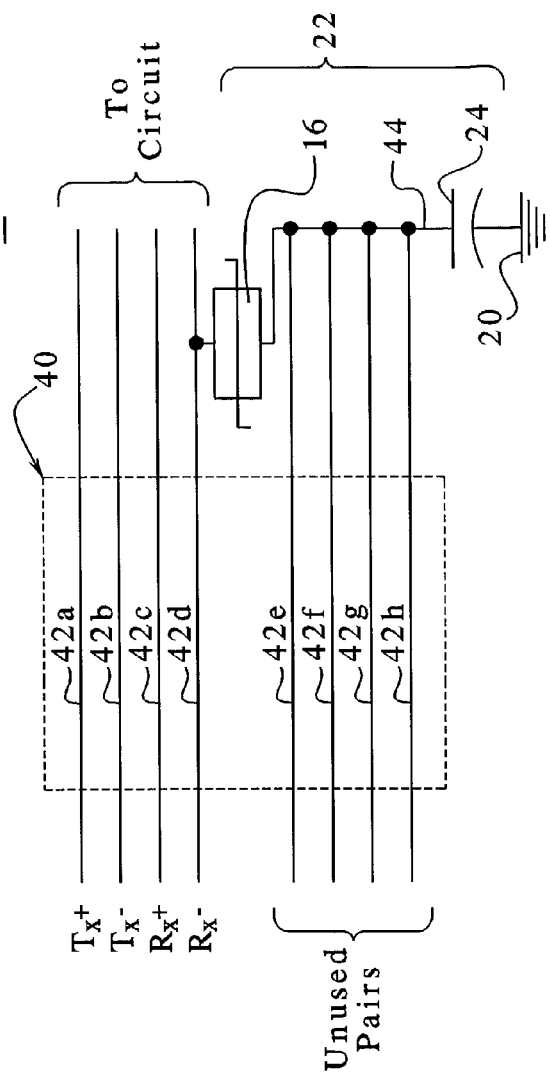
FIG. 3B is a schematic electrical diagram illustrating the ESD apparatus of the present invention in combination with data transmission connector of FIG. 3A.

FIGS. 3A and 3B illustrate one possible electrical configuration for the apparatus 22 in the present invention in combination with a data transmission or RJ-45 connector. FIG. 3A shows a typical configuration for an RJ-45 connector 40. RJ-45 connector 40 has eight contacts 42a to 42h. Typically, two contacts, e.g., contacts 42a and 42b, connect to signal transmission lines, while two contacts, e.g., contacts 42c and 42d connect to signal receiving lines. Four data lines, namely lines 42e through 42h are typically provided but are unused. Since these lines are unused, they are said to be floating, i.e., they are not fixed via an input voltage to either a high or low state. Because the data lines 42e through 42h float, they are each typically electrically coupled to ground by a coupling capacitor 24 on a PCB (not illustrated). The coupling capacitor 24, as described above, blocks DC current that may dissipate through unused lines 42e through 42h and thereby reduces the power consumption of the system. The capacitor 24 is typically chosen to withstand the DC voltages called out in the IEEE 802.3 Ethernet specification.

Many PCB's that contain an RJ-45 connector 40 already include or are specified to include the capacitor 24. FIG. 3B illustrates that the apparatus 22 of the present invention may be readily formed by adding a protection device 16 in series with the existing capacitor 24. FIG. 3B illustrates that the Rx-data line 42d electrically connects to protection device 16, which in turn electrically connects to capacitor 24, which in turn electrically connects to earth ground 20. Of course, protection device 16 may alternatively be placed between the capacitor 24 and ground 20, as long as the trace or lead 44 is connected electrically to the data line 42d.

FIG. 3B illustrates that the apparatus 22 protects the single Rx-data line 42d. It should be appreciated that by extending the trace or lead 44 to any combination or all of the active data lines 42a through 42d, the apparatus 22 of the present invention may protect any number of or all of the data lines. FIGS. 3A and 3B are not intended to limit the application of the present invention to four active data lines; rather, they show one application that makes use of an existing capacitor 24. If all eight data lines 42a through 42h are active, the apparatus 22 may protect any one, a combination of or all eight data lines. Moreover, if desired, the apparatus 22 may be adapted to protect the inactive data lines 42e through 42h illustrated in FIGS. 3A and 3B. Moreover, the present invention is not limited to RJ-45 connectors and is operable with other types of connectors, such as RJ-11, USB and firewire connectors.

In another alternative embodiment (not illustrated), a plurality of apparatuses 22 are employed to protect a combination data lines. In this embodiment, each apparatus 22 may protect one or a plurality of data lines. For example, one apparatus 22 protects data lines 42a and 42b, while another apparatus 22 protects data lines 42c and 42d. This example may be implemented in a number of ways. In one implementation, the two apparatuses 22 share the same capacitor 24 and the same ground connection. In another implementation, the two apparatuses each employ unique capacitors 24 but use the same ground connection. In a further implementation, the two apparatuses each employ unique capacitors 24 and ground connections.

Figure 4:
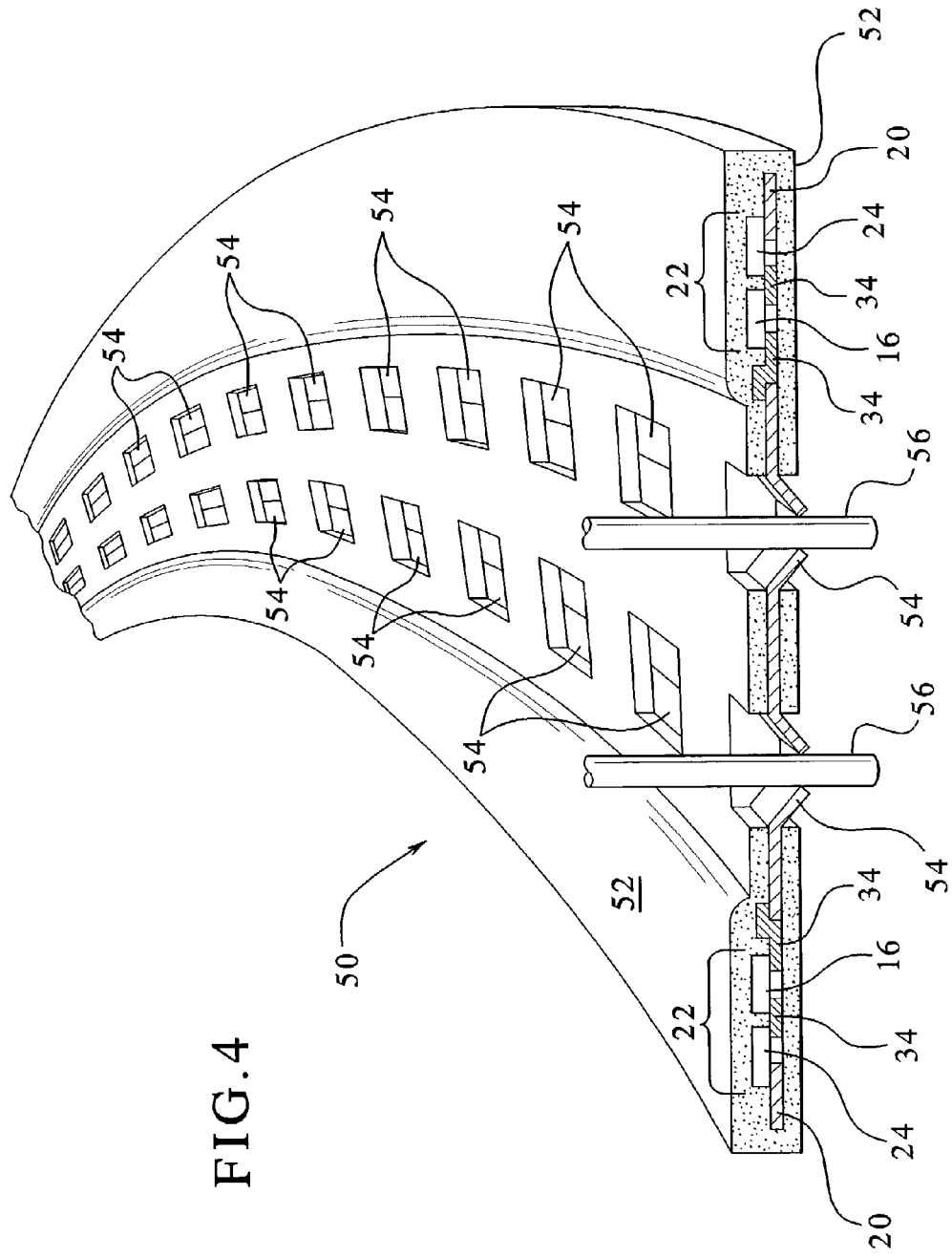
FIG. 4 is a perspective view illustrating the improved ESD apparatus of the present invention employed on a flexible circuit.

Referring now to FIG. 4, another application for the apparatus 22 includes the installation of the apparatus 22 onto a flexible circuit 50. Flexible circuits or "flex circuits" are well known and employ a thin, flexible substrate 52 such as Kapton® film. Flex circuits provide a convenient means for electrically connecting components located on separate fixed structures, e.g., PCB's, within a given system. Flex circuit 50 includes a plurality of spring contacts 54 and at least one ground bus 20. Flex circuit 50 includes a pair of rows of contacts 54 and ground buses 20. The present invention is also operable with flex circuits having other electrical configurations.

Many types of devices may be coupled to flex circuit 50, wherein, e.g., a flex circuit for connecting to an RJ-45 connector would have at least eight spring contacts 54, etc. in another configuration, flex circuit 50 contains the leads or traces 42a through 42h (FIGS. 3A and 3B) that run to an RJ-45 connector mounted elsewhere on a PCB. The apparatus 22 can connect to either the illustrated spring contact 54 or to a data line on the flex circuit, similar to the disclosure in connection with FIGS. 3A and 3B.

As illustrated, spring contact 54 is in one implementation a through-hole type of connection, wherein the spring contact 54 receives a pin 56 of a though-hole type connector or device that is to be mounted to the circuit 50. In another implementation, spring contact 54 is instead a surface-mount pad, wherein a surface-mount connector reflow solders to the pad. In either case the spring contact 54 or pad couples, e.g., via solder a joint 34 to the protection device 16 of apparatus 22, which in turn couples, e.g., via a solder joint 34 to the capacitor 24 of the apparatus 22, which in turn couples to the ground bus 20. Of course, the order of the protection device 16 and capacitor 24, with respect to the spring contact 54 (or pad) and the ground bus 20, may be reversed. In either case, capacitor 24 of the apparatus 22 blocks DC current from travelling between the spring contact 54 (or pad) and the ground bus 20. The protection device 16 shunts an ESD event to the ground bus 20 and/or reflects the signal back towards the source and thereby protects signal lines of the device connected to spring contact 54 via one of the pins 56.

Each of the combinations of apparatuses 22 and data lines discussed above in connection with FIGS. 3A and 3B may be employed on a flex circuit. Further, a plurality of apparatuses 22 may exist on the substrate 52 to protect a plurality of devices. Further still, one or more capacitors 24 can operate with a multiple number of devices 16, and the multiple signal lines of the device may be protected by a single protection device 16.

The protection device 16 contains a voltage variable material ("VVM"). In one embodiment, the VVM includes a composition disclosed in U.S. Pat. No. 6,251,513, entitled "Polymer Composites for Overvoltage Protection", which includes a matrix of conductive and semiconductive particles having an average particle size of less than 10 microns. The matrix further includes insulative particles having an average particle size larger than 300 angstroms. VVM's utilizing relatively small particle sized conductive and semiconductive fillers exhibit clamping voltages in a range of about 30 volts to about 2,000 volts or greater. In other embodiments, the protection device 16 can include any known voltage variable material. Specifically, the voltage variable materials may include any of the following compositions, which are incorporated herein by reference.

U.S. Pat. No. 2,273,704, issued to Grisdale, discloses granular composites which exhibit non-linear current/voltage relationships. These mixtures are comprised of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991 issued to Hyatt et al., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductive and semiconductive particles sized to be in a 10 to 100 micron range. The materials also include a proportion of 100 angstrom sized insulative particles. All of these materials are bonded together in a insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

Additional EOS polymer composite materials are also disclosed in U.S. Pat. Nos. 4,331,948, 4,726,991, 4,977,357, 4,992,333, 5,142,263, 5,189,387, 5,294,374, 5,476,714, 5,669,381 and 5,781,395, the teachings of which are specifically incorporated herein by reference.

The above embodiments have been illustrated and described as including an apparatus 22 of the present invention, which includes an EOS device 16 and a capacitor 24. This implies that apparatus 22 includes at least two separate devices 16 and 24. As illustrated, apparatus 22 can include a separate EOS device 16 and a separate capacitor 24, which is typically provided in the form of a device. As illustrated in connection with FIG. 3B, it may be desirable to couple an EOS device 16 to a capacitor 24 that already exists on a PCB.

In other embodiments, a capacitor or a capacitor material, e.g., a semi-conductive material, and an EOS material may be packaged in a single housing, wherein the capacitor or the capacitor material and the EOS material communicate via at least one electrode. In still another embodiment, a directly applicable voltage variable material ("VVM") set forth in Provisional U.S. Patent application No. 60/370,975, entitled "Voltage Variable Material for Direct Application and Devices Employing Same", assigned to the assignee of this invention, may be employed. This VVM material does not have to be provided in a housing and may therefore be applied directly to a substrate, cured or not cured and then perhaps encapsulated via an epoxy coating. This VVM intrinsically adheres to surfaces, such as a conductive, metal surface or a non-conductive, insulative surface or substrate, and cures without additional processing. Applications using this VVM can be cured however to speed the manufacturing process of same.

The self-curing and self-adhering insulative binder of the VVM disclosed in Provisional Patent application No. 60/370,975 includes a polymer or thermoplastic resin, such as polyester, which is dissolved in a solvent. The polyester resin has a glass transition temperature in the range of 6° C. to 80° C. and a molecular weight between 15,000 and 23,000 atomic mass units ("AMU's"). One suitable solvent for dissolving the polymer is diethylene glycol monoethyl ether acetate, commonly referred to as "carbitol acetatate". In an embodiment, a thickening agent is added to the insulative binder, which increases the viscosity of the insulative binder. For example, the thickening agent can be a fumed silica, such as that found under the tradename Cab-o-Sil TS-720.

The insulative binder of the present invention has a high dielectric breakdown strength, a high electrical resistivity and high tracking impedance. The insulative binder provides and maintains sufficient interparticle spacing between the other possible components of VVM 100, such as conductive particles, insulating particles, semiconductive particles, doped semiconductive particles and various combinations of these. The interparticle spacing, the resistivity and dielectric strength of the insulative binder each affect the high impedance quality of the VVM in its normal state. In an embodiment, the insulative binder has a volume resistivity of at least $10^9$ ohm-cm. It is possible to blend different polymers in the binder and to cross-link same.

It should be understood that various changes and modifications to the presently preferred embodiments described herein will be apparent to those skilled in the art. Such changes and modifications may be made without departing from the spirit and scope of the present invention and without diminishing its attendant advantages.

The invention is claimed as follows:

1. An electrostatic discharge ("ESD") apparatus comprising:
an electrostatic discharge circuit configured to withstand a steady state signal, the circuit including:
an electrical overstress protection device having a polymeric non-ohmic voltage variable material, the voltage variable material susceptible to failure if the steady state signal reaches 2250 Volts DC; and
a capacitor that electrically communicates in series with the protection device, the capacitor configured and arranged to protect the electrical overstress protection device from the high voltage steady state signal.

2. The ESD apparatus of claim 1, which includes a signal line that electrically couples to one of the EOS protection device and the capacitor.

3. The ESD apparatus of claim 2, wherein the signal line is selected from a group consisting of 10BaseT, 100BaseT and 1000BaseT data lines.

4. The ESD apparatus of claim 2, which includes an Ethernet network device that electrically communicates with the signal line.

5. The ESD apparatus of claim 2, which includes a transceiver that electrically communicates with the signal line.

6. The ESD apparatus of claim 1, which includes a ground that electrically communicates with one of the EOS protection device and the capacitor.

7. The ESD apparatus of claim 1, wherein the capacitor is sized so that the EOS protection device can withstand an application of a predetermined direct current voltage.

8. The ESD apparatus of claim 1, wherein the capacitor blocks DC current that travels from a signal line to ground.

9. The ESD apparatus of claim 1, wherein the capacitor couples to an unused data line of a data transmission connector.

10. The ESD apparatus of claim 1, wherein the EOS protection device and the capacitor are affixed to a printed circuit board ("PCB").

11. The ESD apparatus of claim 1, wherein the EOS protection device and the capacitor electrically communicate with at least one PCB trace, and wherein the trace communicates electrically with a data transmission connector.

12. The ESD apparatus of claim 1, wherein the capacitor additionally serves to reduce power consumption.

13. The ESD apparatus of claim 1, wherein the EOS protection device and the capacitor are affixed to a flexible circuit.

14. The ESD apparatus of claim 13, wherein the EOS protection device and the capacitor electrically communicate with a spring contact affixed to the flexible circuit.

15. The ESD apparatus of claim 13, wherein the EOS protection device and the capacitor electrically communicate with a connector pin of an electrical device.

16. The ESD apparatus of claim 13, wherein a plurality of EOS devices and capacitors electrically communicate with a plurality of contacts affixed to the flexible circuit.

17. An electrostatic discharge ("ESD") apparatus comprising:
a polymeric composite voltage variable material ("VVM"); and
a capacitor material that electrically communicates in series with the VVM, the capacitor material sized so that the VVM can withstand an application of a predetermined steady state direct current voltage of at least 2250 volts.

18. The ESD apparatus of claim 17, wherein the VVM includes a matrix of conductive and semiconductive particles.

19. The ESD apparatus of claim 17, wherein the VVM includes irregularly shaped conductor particles having insulative oxide surface coatings that are bound in a matrix.

20. The ESD apparatus of claim 17, wherein the VVM includes a mixture of conductive and semiconductive particles having surfaces coated with an insulative oxide film, the conductive and semiconductive particles being bound together in an insulative binder.

21. The ESD apparatus of claim 17, wherein the VVM includes conductive and semiconductive particles that are coated with an insulative oxide film and that are bound together in point contact with one another.

22. The ESD apparatus of claim 17, wherein the VVM includes conductive and semiconductive particles sized to be 10 to 20 microns.

23. The ESD apparatus of claim 17, wherein the VVM self-adheres directly to a substrate.

24. The ESD apparatus of claim 17, wherein the VVM is disposed inside a housing with the capacitor material.

25. The ESD apparatus of claim 17, wherein the VVM is disposed inside a housing with a capacitor that holds the capacitor material.

26. An electrical circuit for electrostatic discharge suppression comprising:
a signal line;
a polymeric non-ohmic voltage variable material ("VVM") that electrically communicates with the signal line, the VVM susceptible to failure if subjected to a steady state direct current voltage of 2,250 volts;
a capacitor that electrically communicates in series with the VVM, wherein the capacitor is configured to protect the VVM from the steady state direct current voltage; and
a ground that electrically communicates with the capacitor.

27. The electrical circuit of claim 26, which includes an Ethernet network device that electrically communicates with the signal line.

28. The electrical circuit of claim 26, wherein the capacitor additionally serves to reduce power consumption.

29. The electrical circuit of claim 26, wherein the VVM is disposed in a manner selected from the group consisting of: in a device, on a flex circuit and applied directly to a substrate.

* * * * *